US012799566B2

(12) United States Patent
Fan et al.

(10) Patent No.: US 12,799,566 B2
(45) Date of Patent: Nov. 17, 2026

(54) ALUMINUM ALLOY, ELECTRONIC DEVICE, AND ALUMINUM ALLOY PREPARATION METHOD

(71) Applicant: HUAWEI TECHNOLOGIES CO., LTD., Shenzhen (CN)

(72) Inventors: Li Fan, Dongguan (CN); Hua Wang, Dongguan (CN); Banghong Hu, Dongguan (CN); Li Pang, Dongguan (CN); Han Yan, Dongguan (CN); Xiaojun Yang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 504 days.

(21) Appl. No.: 18/471,511

(22) Filed: Sep. 21, 2023

(65) Prior Publication Data

US 2024/0011130 A1 Jan. 11, 2024

Related U.S. Application Data

(63) Continuation of application No. PCT/CN2022/082057, filed on Mar. 21, 2022.

(30) Foreign Application Priority Data

Mar. 22, 2021 (CN) ........................ 202110304145.0

(51) Int. Cl.
*C22C 21/02* (2006.01)
*B22D 17/00* (2006.01)
(Continued)

(52) U.S. Cl.
CPC .............. *C22C 21/02* (2013.01); *B22D 17/00* (2013.01); *C22C 1/026* (2013.01); *C22C 1/03* (2013.01); *C22F 1/043* (2013.01); *H05K 5/04* (2013.01)

(58) Field of Classification Search
CPC ......... C22C 21/02; C22C 21/04; C22C 1/026; C22C 1/03; C22F 1/043; B22D 17/00; H05K 5/04
See application file for complete search history.

(56) References Cited

U.S. PATENT DOCUMENTS

2019/0203324 A1 7/2019 Liu et al.
2021/0044685 A1* 2/2021 Bui Dac ............... G06F 1/1637

FOREIGN PATENT DOCUMENTS

CN 101392340 A 3/2009
CN 107253027 A * 10/2017 ............ B22D 17/00
(Continued)

OTHER PUBLICATIONS

Jones, G. Pcarson, and J. Pearson. "Factors affecting the grain-refinement of aluminum using titanium and boron additives." Metallurgical Transactions B 7.2 (1976): 223-234.*

*Primary Examiner* — Jessee R Roe
(74) *Attorney, Agent, or Firm* — NIXON & VANDERHYE PC

(57) ABSTRACT

This application provides an aluminum alloy, an electronic device, and an aluminum alloy preparation method. The aluminum alloy, based on mass percentage, includes the following components: silicon: 8.0%-10.0%, magnesium: 0.001%-0.2%, manganese: 0.001%-0.09%, iron: 0.7%-1.3%, and strontium: 0.001%-0.05%, with a balance of aluminum and inevitable impurities, where the inevitable impurities account for ≤0.15%. The aluminum alloy has characteristics of a high heat conductivity, good molding performance, favorable corrosion resistance, and favorable mechanical properties without heat treatment.

19 Claims, 2 Drawing Sheets

(51) Int. Cl.

| | |
|---|---|
| ***C22C 1/02*** | (2006.01) |
| ***C22C 1/03*** | (2006.01) |
| ***C22F 1/043*** | (2006.01) |
| ***H05K 5/04*** | (2006.01) |

(56) References Cited

FOREIGN PATENT DOCUMENTS

| | | | |
|---|---|---|---|
| CN | 107520418 | A | 12/2017 |
| CN | 108546853 | A | 9/2018 |
| CN | 109554589 | A | 4/2019 |
| CN | 109988945 | A | 7/2019 |
| CN | 110343918 | A | 10/2019 |
| CN | 111500903 | A | 8/2020 |
| CN | 112159916 | A | 1/2021 |
| CN | 112176234 | A | 1/2021 |
| EP | 4170051 | A1 | 4/2023 |
| WO | 2021254154 | A1 | 12/2021 |

* cited by examiner

ALUMINUM ALLOY, ELECTRONIC DEVICE, AND ALUMINUM ALLOY PREPARATION METHOD

CROSS-REFERENCE TO RELATED APPLICATIONS

This application is a continuation of International Application No. PCT/CN2022/082057, filed on Mar. 21, 2022, which claims priority to Chinese Patent Application No. 202110304145.0, filed on Mar. 22, 2021. The disclosures of the aforementioned applications are hereby incorporated by reference in their entireties.

TECHNICAL FIELD

This application relates to the field of aluminum alloys, and specifically, to an aluminum alloy, an electronic device, and an aluminum alloy preparation method.

BACKGROUND

With the development of communication technologies and gradual popularization of a 5G network, communication products are continuously developing towards high power, miniaturization, and light weight. Therefore, a higher requirement is imposed on a heat dissipation capability of a die casting housing of an electronic device such as a communication product. To improve the heat dissipation capability of the die casting housing, a die casting material used to prepare the die casting housing needs to have a high heat conductivity, and a structure of the die casting housing needs to be improved, for example, a large quantity of complex thin-wall heat sink fins, high and low bosses, and a deep cavity structure need to be designed, so that the die casting housing has favorable heat conduction performance. Because various structures that facilitate heat dissipation need to be made for the die casting housing, and the die casting housing needs to be integrally die-casted and molded during preparation, the die casting material needs to have favorable casting molding performance in addition to the high heat conductivity.

At present, a commonly used die casting material for a communication product is a die casting aluminum alloy, and existing die casting aluminum alloys are mainly eutectic or near-eutectic Al—Si series alloys. Some aluminum alloys have good mechanical properties and meet assembly strength requirements, but have low heat conductivities, and the heat conductivities are generally 90-150 W/(m·K). Typical die casting aluminum alloys include an ADC12 alloy (Japanese designation, equivalent to a domestic alloy YL113) and a European standard EN 43500 alloy, where ADC indicates Aluminum-Alloy Die Castings. Molding performance and mechanical properties of the ADC12 alloy are excellent. However, a heat conductivity of the ADC12 alloy in a die casting state is only 96 W/(m·K), and corrosion resistance is low. Therefore, the ADC12 alloy cannot meet heat dissipation and environmental application requirements of current communication products. Molding performance, mechanical properties, and corrosion resistance of the EN 43500 alloy are excellent. However, a heat conductivity of the EN 43500 alloy in a die casting state is about 140 W/(m·K). This requires heat treatment to meet a use requirement of 160 W/(m·K). In addition to increasing preparation costs of the die casting housing, the heat treatment further reduces hardness of the die casting housing. Consequently, thread slipping easily occurs in a die casting housing assembly process. Therefore, it has become an urgent problem to develop an aluminum alloy that is used for a die casting housing and that has a high heat conductivity, good molding performance, favorable corrosion resistance, and favorable mechanical properties.

SUMMARY

This application provides an aluminum alloy, an electronic device, and an aluminum alloy preparation method, so that a die casting aluminum alloy that has a high heat conductivity, good molding performance, favorable corrosion resistance, and favorable mechanical properties can be obtained without heat treatment.

According to a first aspect, this application provides an aluminum alloy. Based on mass percentage, the aluminum alloy includes the following components: silicon: 8.0%-10.0%, magnesium: 0.001%-0.2%, manganese: 0.001%-0.09%, iron: 0.7%-1.3%, and strontium: 0.001%-0.05%, with a balance of aluminum and inevitable impurities, where the inevitable impurities account for ≤0.15%.

According to the aluminum alloy provided in this application, the silicon with a mass fraction of 8.0%-10.0% is added, to improve molding performance of the aluminum alloy. In addition, the strontium with a mass fraction of 0.001%-0.05% is added, to control a size of eutectic silicon in an organization structure of the aluminum alloy, so as to improve a heat conductivity of the aluminum alloy. In addition, by adding the magnesium with a mass fraction of 0.001%-0.2%, the manganese with a mass fraction of 0.001%-0.09%, and the iron with a mass fraction of 0.7%-1.3%, on the premise that a die casting molding performance requirement is met, lattice distortion can be effectively reduced, and dislocation can be reduced. When the heat conductivity is improved, the aluminum alloy has specific mechanical properties (including properties such as hardness and strength) and corrosion resistance. Therefore, the aluminum alloy with excellent comprehensive performance and used for die casting molding can be obtained. Before heat treatment is performed on the aluminum alloy in this application, a heat conductivity of the aluminum alloy in a die casting state may reach 160-170 W/(m·K), yield strength may reach 120-140 MPa, and hardness may reach more than 65 HBW. The heat conductivity of the aluminum alloy can reach the performance of an existing ADC12 alloy and an existing EN 43500 alloy that are obtained after heat treatment, and comprehensive performance of the aluminum alloy also exceeds that of the ADC12 alloy and the EN 43500 alloy. Therefore, the aluminum alloy in this application can meet a high heat conductivity requirement even if heat treatment is not performed, and the mechanical properties of the aluminum alloy can effectively prevent a slipping problem in an assembly process.

In a preferred implementation of this application, based on mass percentage, the aluminum alloy includes the following components: silicon: 8.0%-9.5%, magnesium: 0.05%-0.15%, manganese: 0.001%-0.05%, iron: 0.7%-1.0%, and strontium: 0.01%-0.05%, with a balance of aluminum and inevitable impurities, where the inevitable impurities account for ≤0.15%. In a further preferred implementation of this application, based on mass percentage, the aluminum alloy includes the following components: silicon: 8.2%-9.4%, magnesium: 0.05%-0.09%, manganese: 0.001%-0.02%, iron: 0.72%-0.85%, and strontium: 0.02%-0.05%, with a balance of aluminum and inevitable impurities, where the inevitable impurities account for ≤0.15%. By optimizing the components of the aluminum alloy, the heat conductivity and the molding performance of the aluminum alloy can further be improved, and the mechanical properties can meet a use requirement.

In an optional implementation of this application, based on mass percentage the aluminum alloy further includes copper not exceeding 0.1%, preferably not exceeding 0.05%, and further preferably not exceeding 0.02%. In a further preferred implementation, based on mass percentage, an amount of copper may be 0.001%-0.1%, preferably 0.001%-0.05%, and further preferably 0.001%-0.02%. By adding specific amount of copper, the copper can act together with silicon and magnesium to further improve the heat conductivity and the mechanical properties of the aluminum alloy, and the corrosion resistance of the aluminum alloy meets the requirement at the same time. “Not exceeding” mentioned in the implementations of this application is equivalent to “less than or equal to”.

In an optional implementation of this application, based on mass percentage, the aluminum alloy further includes zinc not exceeding 0.1%, preferably not exceeding 0.05%, and further preferably not exceeding 0.02%. In a further preferred implementation, based on mass percentage, an amount of the zinc may be 0.001%-0.1%, preferably 0.001%-0.05%, and further preferably 0.001%-0.02%. By adding specific amount of zinc, solid solution strengthening and dispersion strengthening of alloy elements are improved, to further improve the mechanical properties of the aluminum alloy.

In an optional implementation of this application, based on mass percentage, the aluminum alloy further includes titanium not exceeding 0.1%, preferably not exceeding 0.05%, and further preferably not exceeding 0.02%. In a further preferred implementation, based on mass percentage, an amount of the titanium may be 0.001%-0.1%, preferably 0.001%-0.05%, and further preferably 0.001%-0.02%. By adding specific amount of titanium, grains can be refined to further improve the mechanical properties of the aluminum alloy.

In an optional implementation of this application, when the aluminum alloy is in a die casting state, a heat conductivity is ≥160 W/(m·K), yield strength is ≥120 MPa, tensile strength is ≥200 MPa, an elongation rate is ≥2%, Brinell hardness is 60-80 HBW, and a corrosion rate is ≤4.5 mg/(dm2·d). Specifically, in a possible implementation of this application, when the aluminum alloy is in the die casting state, the heat conductivity is 160-170 W/(m·K), the yield strength is 120-140 MPa, the tensile strength is ≥210 MPa, the elongation rate is ≥4%, the hardness is ≥65 HBW, and the corrosion rate is ≤4.5 mg/($dm^2$·d). It should be noted that, in this application, the die casting state of the aluminum alloy is a state of the aluminum alloy molded after die casting molding is performed on an alloy melt. In the die casting state, heat treatment is not performed on the aluminum alloy.

After heat treatment is performed on the aluminum alloy, the heat conductivity is ≥180 W/(m·K), the yield strength is ≥100 MPa, the tensile strength is ≥180 MPa, the elongation rate is ≥2%, the Brinell hardness is 60-80 HBW, and the corrosion rate is ≤4.5 mg/($dm^2$ d). In an optional implementation of this application, after heat treatment is performed on the aluminum alloy, the heat conductivity is 180 W/(m·K), the yield strength is 110-120 MPa, the tensile strength is 190 MPa, the elongation rate is ≥4%, the hardness is 60 HBW, and the corrosion rate is ≤4.5 mg/($dm^2$·d).

The aluminum alloy in this implementation of this application has relatively good fluidity in addition to the high heat conductivity, the high mechanical properties, and the high hardness, so that the aluminum alloy has good molding performance and reduces a molding defect. Therefore, the aluminum alloy can achieve good comprehensive performance, to meet a requirement for preparing a large die casting structural part.

According to a second aspect, this application provides a method for preparing the aluminum alloy according to the first aspect of this application, including: mixing and melting raw materials that are weighed and obtained based on components of the aluminum alloy, and then performing die casting molding.

After the raw materials are selected based on the components of the aluminum alloy in the first aspect of this application, and mixing and melting and die casting molding are performed, a heat conductivity of the aluminum alloy is 160-170 W/(m·K), yield strength is 120-140 MPa, tensile strength is ≥210 MPa, an elongation rate is ≥4%, hardness is ≥65 HBW, and a corrosion rate is ≤4.5 mg/($dm^2$·d). The heat conductivity of the aluminum alloy is far higher than a heat conductivity 96 W/(m·K) of an existing ADC12 alloy, the corrosion rate is far lower than a corrosion rate 34 mg/($dm^2$·d) of the ADC12 alloy, and the yield strength, the tensile strength, and the hardness are equivalent to corresponding parameters of the ADC12 alloy. In addition, compared with an EN 43500 alloy, the heat conductivity of the aluminum alloy is higher than a heat conductivity 140 W/(m·K) of the EN 43500 alloy, and the mechanical properties are equivalent to corresponding parameters of the EN 43500 alloy. Therefore, a requirement of heat conductivity and mechanical properties of a die casting aluminum alloy can be met with the aluminum alloy of this application even if only in a die casting state with no heat treatment. This can effectively reduce costs and avoid hardness reduction.

In a possible implementation of this application, after the die casting molding, the method further includes a heat treatment step. When there is a higher requirement on the heat conductivity of the die casting aluminum alloy, heat treatment may be performed on the aluminum alloy obtained after the die casting molding, to further improve the heat conductivity of the aluminum alloy.

In a possible implementation of this application, a temperature of the heat treatment is 180-350° C., preferably 200-320° C., and further preferably 240-280° C.; and duration of the heat treatment is 0.5-6 h, preferably 1-4 h, and further preferably 2-3 h. By limiting the temperature and the duration of the heat treatment, an internal defect of the aluminum alloy can be eliminated, and the heat conductivity can further be improved. In addition, the heat treatment process can also keep the aluminum alloy with high hardness, to meet an assembly requirement of a die casting part and prevent a thread slipping problem.

According to a third aspect, this application provides a die casting part. The die casting part is prepared by using the aluminum alloy in the first aspect of this application or by using the method in the second aspect of this application.

The aluminum alloy in this application may be used to prepare die casting parts of various types, for example, a die casting housing, a die casting base, a die casting automobile accessory, a die casting air conditioner accessory, and a die casting building accessory. Specifically, selection may be performed according to an actual application, and a specific type of the die casting part is not limited herein.

The die casting housing formed by using the aluminum alloy in the first aspect of this application may be used as a packaging housing of a communication device, so that heat inside the communication device can be easily dissipated while a packaging function is implemented.

According to a fourth aspect, this application provides an electronic device. The electronic device includes a housing, and the housing includes the die casting part in the third aspect of this application. The die casting part is, for example, a die casting housing.

The electronic device may be, for example, a communication device. In the communication device, a case of a large-scale input/output system, a case of a remote radio unit, and a case of an active antenna processing unit may all be formed by using the die casting housing in this application. In addition to the communication device, the electronic device in embodiments of this application may further include a device such as an electronic computer, a digital control device, a program-controlled device, an air conditioner, a refrigerator, or a microwave oven. A housing of the foregoing electronic device may be formed by the die casting part such as the die casting housing in this application.

Figure 1:
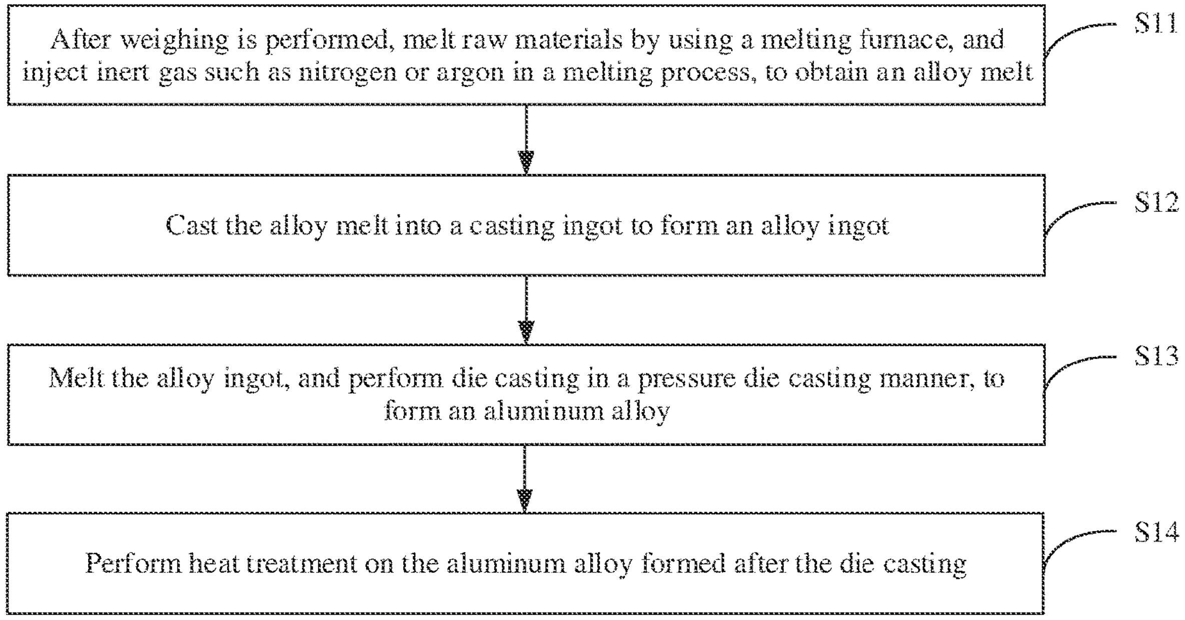
FIG. 1 is a schematic diagram of a preparation process of an aluminum alloy according to an embodiment of this application.

Reference numerals: 1—die casting housing; 11—thin-wall heat sink fin.

DESCRIPTION OF EMBODIMENTS

To make the objectives, technical solutions, and advantages of this application clearer, the following further describes this application in detail with reference to the accompanying drawings.

Terms used in the following embodiments are merely intended to describe particular embodiments, but are not intended to limit this application. As used in the specification and appended claims of this application, singular expressions "one", "a", "the", "the foregoing", "this", and "the one" are also intended to include expressions such as "one or more", unless otherwise specified in the context clearly.

Reference to "an embodiment", "some embodiments", or the like described in this specification indicates that one or more embodiments of this application include a specific feature, structure, or characteristic described with reference to the embodiments. Therefore, statements such as "in an embodiment", "in some embodiments", "in some other embodiments", and "in other embodiments" that appear at different places in this specification do not necessarily mean reference to a same embodiment, instead, they mean "one or more but not all of embodiments", unless otherwise specifically emphasized in another manner. The terms "include", "contain", "have", and their variants all mean "include but are not limited to", unless otherwise specifically emphasized in another manner.

Because an electronic device like a communication product is continuously developing towards high power, miniaturization, and light weight, a heat dissipation requirement for a package housing of such electronic device is also continuously improved. Currently, die casting aluminum alloys commonly used in the communication product are an ADC12 alloy and an EN 43500 alloy. A heat conductivity of the ADC12 alloy in a die casting state is only 96 W/(m·K), and a heat conductivity of the EN 43500 alloy in a die casting state is about 140 W/(m·K). Although the heat conductivity of the EN 43500 alloy is greatly improved compared with that of the ADC12 alloy, the EN 43500 alloy still cannot meet a requirement of the communication product for using a large die casting part. After heat treatment is performed on the EN 43500 alloy, the heat conductivity of the EN 43500 alloy can be increased to 160 W/(m·K). However, mechanical properties of a material are inevitably reduced, and a thread slipping risk may occur in an assembly process. In addition, a heat treatment process will increase manufacturing costs, and defects such as material deformation and bubbles in the heat treatment process will also affect a yield rate. Therefore, current mainstream die casting aluminum alloys cannot meet comprehensive requirements of the communication product in terms of a heat conductivity, molding performance, corrosion resistance, and mechanical properties at the same time.

To resolve the foregoing technical problems, an embodiment of this application provides an aluminum alloy. Based on mass percentage, the aluminum alloy includes the following components: silicon: 8.0%-10.0%, magnesium: 0.001%-0.2%, manganese: 0.001%-0.09%, iron: 0.7%-1.3%, and strontium 0.001%-0.05%, with a balance of aluminum and inevitable impurities, where the inevitable impurities account for ≤0.15%.

It should be noted that, in embodiments of this application, a matrix material of the aluminum alloy is aluminum, and based on mass percentage, a sum of the mass percentage of all components is 100%. The inevitable impurities may include impurities introduced by various components of raw materials and impurities introduced by various production devices and tools in a preparation process, for example, including but not limited to one of or a combination of at least two of chromium, nickel, beryllium, calcium, cadmium, cobalt, lithium, zirconium, vanadium, boron, tin, lead, phosphorus, molybdenum, or sodium. In order not to affect final performance of the aluminum alloy, amount of the inevitable impurities needs to be controlled below 0.15%. For example, an amount of finally introduced impurities may be controlled by controlling purity of the raw material and cleanness of the device in the preparation process.

According to the aluminum alloy in embodiments of this application, the amount of the silicon is controlled within 8.0%-10.0%, to improve a heat conductivity of the aluminum alloy and ensure molding performance of the aluminum alloy; the amount of magnesium, manganese, and iron elements is properly controlled, so that the aluminum alloy has specific mechanical properties and corrosion resistance performance; and a size of eutectic silicon of the aluminum alloy is controlled by adding a proper strontium element, to improve the heat conductivity.

In an embodiment of this application, when the aluminum alloy is in a die casting state, the heat conductivity is ≥160 W/(m·K), yield strength is ≥120 MPa, tensile strength is ≥200 MPa, an elongation rate is ≥2%, Brinell hardness is 60-80 HBW, and a corrosion rate is ≤4.5 mg/(dm$^2$·d). Specifically, in an embodiment of this application, when the aluminum alloy is in the die casting state, the heat conductivity may be 160-170 W/(m·K), the yield strength is 120-140 MPa, the tensile strength is ≥210 MPa, the elongation rate is ≥4%, the hardness is ≥65 HBW, and the corrosion rate is ≤4.5 mg/(dm$^2$·d).

In an embodiment of this application, after heat treatment is performed on the aluminum alloy, the heat conductivity is ≥180 W/(m·K), the yield strength is ≥100 MPa, the tensile strength is ≥180 MPa, the elongation rate is ≥2%, the Brinell hardness is 60-80 HBW, and the corrosion rate is ≤4.5 mg/($dm^2$·d). Specifically, in an embodiment of this application, after heat treatment is performed on the aluminum alloy in embodiments of this application, the heat conductivity is 180 W/(m·K), the yield strength is 110-120 MPa, the tensile strength is ≥190 MPa, the elongation rate is ≥4%, the hardness is ≥60 HBW, and the corrosion rate is ≤4.5 mg/($dm^2$·d).

In this way, the aluminum alloy in embodiments of this application can meet a product use requirement of a heat conductivity ≥160 W/(m·K) without heat treatment. For an electronic device having a high heat conductivity requirement, a die casting housing manufacturing process can be shortened, and manufacturing costs of the die casting housing can be reduced. In addition, the aluminum alloy in embodiments of this application may further meet a requirement of an electronic device for a higher heat conductivity through heat treatment.

In embodiments of this application, adding silicon can effectively improve fluidity of the aluminum alloy. However, as silicon elements increase, the heat conductivity of the aluminum alloy decreases. In embodiments of this application, the amount of the silicon is controlled to be 8.0%-10.0%, to improve fluidity of the aluminum alloy and effectively reduce generation of a primary silicon phase and a eutectic silicon phase in the aluminum alloy, so as to improve the heat conductivity of the aluminum alloy. Therefore, in embodiments of this application, the amount of the silicon can enable the aluminum alloy to have relatively good liquidity to meet a requirement for molding performance of the aluminum alloy, and enable the aluminum alloy to have a high heat conductivity. In an embodiment of this application, the amount of the silicon is 8.0%-9.5%. In a further preferred embodiment, the amount of the silicon is 8.2%-9.4%. In a still further preferred embodiment, the amount of the silicon is 8.7%-9.4%. By optimizing a proportion of the silicon in the aluminum alloy, an effect of the silicon can be further improved, and when the molding performance of the aluminum alloy is improved, a high heat conductivity of the aluminum alloy is maintained.

Based on mass percentage, a mass proportion of the silicon in the aluminum alloy is typically but not limited to 8.0%, 8.1%, 8.2%, 8.3%, 8.4%, 8.5%, 8.6%, 8.7%, 8.8%, 8.9%, 9.0%, 9.1%, 9.2%, 9.3%, 9.4%, 9.5%, 9.6%, 9.7%, 9.8%, 9.9%, or 10.0%.

The magnesium element will be solidly dissolved in the aluminum matrix in die casting state. This can effectively improve the strength of aluminum alloy. After heat treatment, the magnesium and the silicon can form a dispersive $Mg_2Si$ precipitation phase, and the precipitation phase hinders dislocation movement, thereby improving the mechanical properties of the material. By controlling the amount of the magnesium within 0.001%-0.2%, further controlling the amount within 0.05%-0.15%, and still further controlling the amount within a range of 0.05%-0.09%, the strength and the mechanical properties of the aluminum alloy can be improved, and lattice distortion can be reduced, thereby preventing a decrease in the heat conductivity.

Based on mass percentage, a mass proportion of the magnesium in the aluminum alloy is typically but not limited to 0.001%, 0.002%, 0.005%, 0.008%, 0.01%, 0.02%, 0.03%, 0.04%, 0.05%, 0.06%, 0.07%, 0.08%, 0.09%, 0.10%, 0.11%, 0.12%, 0.13%, 0.14%, 0.15%, 0.16%, 0.17%, 0.18%, 0.19%, or 0.2%.

Addition of the manganese element can effectively change a form of an iron phase in an organization structure of aluminum alloy and improve the mechanical properties of the aluminum alloy. By controlling an addition amount of the manganese element within 0.001-0.09%, the mechanical properties of the aluminum alloy can be improved without reducing the heat conductivity of the aluminum alloy. In a preferred embodiment of this application, the amount of the manganese is controlled within 0.001%-0.05%. When the manganese amount is further controlled within 0.001%-0.02%, a better comprehensive effect is obtained.

Based on mass percentage, a mass proportion of the manganese in the aluminum alloy is typically but not limited to 0.001%, 0.002%, 0.005%, 0.008%, 0.01%, 0.015%, 0.02%, 0.025%, 0.03%, 0.035%, 0.04%, 0.045%, 0.05%, 0.055%, 0.06%, 0.065%, 0.07%, 0.075%, 0.08%, 0.085%, or 0.09%.

Addition of the iron element can improve a mold removal capability of the aluminum alloy after die casting molding. By controlling an addition amount of the iron within 0.7%-1.3%, the aluminum alloy can be easily removed from a mold after die casting molding, and the aluminum alloy can maintain high mechanical properties. In a preferred embodiment of this application, when the amount of the iron is controlled within 0.7%-1.0%, and is further controlled within 0.72%-0.85%, a brittle needle-like phase that contains the iron in the organization structure of the aluminum alloy can be effectively reduced, thereby further helping improve the mechanical properties of the aluminum alloy.

Based on mass percentage, a mass proportion of the iron in the aluminum alloy is typically but not limited to 0.7%, 0.72%, 0.74%, 0.76%, 0.78%, 0.8%, 0.82%, 0.85%, 0.87%, 0.9%, 0.92%, 0.95%, 0.98%, 1.0%, 1.05%, 1.1%, 1.12%, 1.15%, 1.17%, 1.2%, 1.22%, 1.25%, 1.28%, or 1.3%.

Addition of the strontium element can effectively control a size of the eutectic silicon phase, reduce an obstacle to the eutectic silicon phase relative to free electron motion, to improve the heat conductivity of the aluminum alloy. In a preferred embodiment of this application, the amount of the strontium is controlled within 0.01%-0.05%, and when the amount is further controlled within 0.02%-0.05%, an aluminum alloy with a better heat conductivity may be obtained.

Based on mass percentage, a mass proportion of the strontium in the aluminum alloy is typically but not limited to 0.001%, 0.002%, 0.005%, 0.008%, 0.01%, 0.015%, 0.02%, 0.025%, 0.03%, 0.035%, 0.04%, 0.045%, or 0.05%.

In an embodiment of this application, based on mass percentage, the aluminum alloy further includes copper not exceeding 0.1%, preferably not exceeding 0.05%, and further preferably not exceeding 0.02%. In an embodiment of this application, based on mass percentage, the amount of the copper may be 0.001%-0.1%, preferably 0.001%-0.05%, and further preferably 0.001%-0.02%. Adding the copper element can effectively improve the mechanical properties of the aluminum alloy. By controlling an addition amount of the copper within the foregoing range, the aluminum alloy can maintain a high heat conductivity and high corrosion resistance while obtaining an excellent mechanical property. Based on mass percentage, a mass proportion of the copper in the aluminum alloy is typically but not limited to 0.001%, 0.002%, 0.005%, 0.008%, 0.01%, 0.015%, 0.02%, 0.025%, 0.03%, 0.035%, 0.04%, 0.045%, 0.05%, 0.055%, 0.06%, 0.065%, 0.07%, 0.075%, 0.08%, 0.085%, 0.09%, 0.095%, or 0.1%.

In an embodiment of this application, based on mass percentage, the aluminum alloy further includes zinc not exceeding 0.1%, preferably not exceeding 0.05%, and further preferably not exceeding 0.02%. In an embodiment of this application, based on mass percentage, the amount of the zinc may be 0.001%-0.1%, preferably 0.001%-0.05%, and further preferably 0.001%-0.02%. Adding the zinc element can improve the strength of the alloy through solid solution enhancement.

Based on mass percentage, a mass proportion of the zinc in the aluminum alloy is typically but not limited to 0.001%, 0.002%, 0.005%, 0.008%, 0.01%, 0.015%, 0.02%, 0.025%, 0.03%, 0.035%, 0.04%, 0.045%, 0.05%, 0.055%, 0.06%, 0.065%, 0.07%, 0.075%, 0.08%, 0.085%, 0.09%, 0.095%, or 0.1%.

In an embodiment of this application, based on mass percentage, the aluminum alloy further includes titanium not exceeding 0.1%, preferably not exceeding 0.05%, and further preferably not exceeding 0.02%. In an embodiment of this application, based on mass percentage, the amount of the titanium may be 0.001%-0.1%, preferably 0.001%-0.05%, and further preferably 0.001%-0.02%. Adding the titanium element can generate an $Al_3Ti$ phase in the casting process of the aluminum alloy, to refine grains and improve strength and plasticity of the alloy.

Based on mass percentage, a mass proportion of the titanium in the aluminum alloy is typically but not limited to 0.001%, 0.002%, 0.005%, 0.008%, 0.01%, 0.015%, 0.02%, 0.025%, 0.03%, 0.035%, 0.04%, 0.045%, 0.05%, 0.055%, 0.06%, 0.065%, 0.07%, 0.075%, 0.08%, 0.085%, 0.09%, 0.095%, or 0.1%.

When the aluminum alloy in embodiments of this application includes the foregoing components, the organization structure formed by the aluminum alloy may include the following several phase structures: a subeutectic α-Al phase, a eutectic α-Al phase, a eutectic Si phase, and an intermetallic compound. The phases in the organization structure refer to components having a same chemical component, a same atomic aggregation state, and uniform and continuous properties, and different phases are separated through interfaces. The intermetallic compound refers to a compound formed between metals or between a metal and a metalloid. In the organization structure of the aluminum alloy in embodiments of this application, the intermetallic compound mainly includes an $Mg_2Si$ phase, an $Al_3Fe$ phase, an Al—Si—Fe phase, and an Al—Si—Fe—Mn phase. When the components of the aluminum alloy further include an element Cu, the intermetallic compound further includes an $Al_2Cu$ phase structure, an Al—Cu—Fe ternary compound phase structure, and the like. The iron, copper, magnesium, manganese, zinc, and titanium may be partially solidly dissolved in the subeutectic α-Al phase and the eutectic α-Al phase in an atomic form, the $Mg_2Si$ phase is evenly distributed in a dispersion manner, and the intermetallic compound may be distributed on an interface of several phase structures or in the subeutectic α-Al phase and the eutectic α-Al phase.

In a process of preparing the aluminum alloy, various alloyed elements are usually added to a pure metal aluminum to implement a specific performance requirement. However, the addition of the alloyed elements may reduce an ordered arrangement of material lattices, and may cause lattice distortion and periodic movement limitation of an electron, thereby reducing a heat conductivity of the material. According to the aluminum alloy provided in embodiments of this application, impact of all alloyed elements on comprehensive performance of the materials is fully considered, including a heat conductivity, fluidity, corrosion resistance, hardness performance, strength performance, and the like, and a joint action of the alloyed elements is balanced in component design, to obtain an aluminum alloy that has a high heat conductivity, excellent molding performance, high corrosion resistance, and specific mechanical properties. The aluminum alloy meets requirements for molding and heat dissipation of a high heat consumption density and high power communication product of a complex structure, and can resolve a problem that a heat conductivity of an existing die casting aluminum alloy can meet a use requirement only by adding a heat treatment process. In conclusion, according to the aluminum alloy in embodiments of this application, the components of the aluminum alloy are properly designed, so that the heat conductivity of the aluminum alloy in the die casting state is greatly improved, and the heat treatment process is not required without reducing a heat conductivity target of a product, thereby effectively simplifying the processing process and reducing production costs.

An embodiment of this application further provides a method for preparing the aluminum alloy in the foregoing embodiments of this application. The method includes steps: mixing and melting raw materials that are weighed and obtained based on the components of the aluminum alloy in the foregoing embodiments of this application, and then performing die casting molding processing.

The raw materials are weighed and obtained based on the components of the aluminum alloy in the foregoing embodiment of this application, and the raw materials are mixed and melted, and then die casting molding processing is performed, to obtain an aluminum alloy whose heat conductivity is ≥160 W/(m·K), yield strength is ≥120 MPa, tensile strength is ≥200 MPa, an elongation rate is ≥2%, Brinell hardness is ≥60-80 HBW, and a corrosion rate is ≤4.5 $mg/(dm^2\ d)$. The aluminum alloy obtained after the die casting molding processing has advantages of a high heat conductivity and high mechanical properties even if no heat treatment is performed, and may be used for a die casting housing in an electronic device. In addition, the aluminum alloy of the components has good molding performance, and can be used for die casting of a complex thin-wall housing.

FIG. 1 is a schematic diagram of a preparation process of an aluminum alloy according to an embodiment of this application. As shown in FIG. 1, in an embodiment of this application, after the raw materials that are weighed and obtained based on the components of the aluminum alloy in the foregoing embodiments of this application are mixed and melted, performing die casting processing may specifically include the following steps.

Step S11: After the components of the aluminum alloy in embodiments of this application are weighed, melt the raw materials by using a melting furnace, and inject inert gas such as nitrogen or argon in a melting process, to obtain an alloy melt.

Step S12: Cast the alloy melt into a casting ingot to form an alloy ingot.

Step S13: Melt the alloy ingot, and perform die casting in a pressure die casting manner of liquid die casting, semi-solid die casting, vacuum die casting, or extrusion casting, to form an aluminum alloy.

Process parameters of the liquid die casting, the semi-solid die casting, the vacuum die casting, and the extrusion casting are not specifically limited, and may be selected and based on a selected raw material and an actual device parameter.

Still refer to FIG. 1. In an embodiment of this application, after die casting molding, the method further includes the following step.

Step S14: Perform heat treatment on the aluminum alloy molded after die casting. An aluminum alloy with a higher heat conductivity may be obtained through heat treatment, to meet a requirement of an electronic product that has a higher requirement for guiding performance.

A temperature of the heat treatment is 180-350° C., preferably 200-320° C., and further preferably 260-320° C.; and duration of the heat treatment is 0.5-6 h, preferably 1-4 h, and further preferably 2-3 h. After low temperature heat treatment of 180° C.-350° C., especially 260-320° C., concentration of point defects of a vacancy and the like of the alloy can be significantly reduced, lattice distortion of the alloy can be reduced, and the heat conductivity of the alloy can further be improved.

The following further describes the aluminum alloy in this application in detail with reference to specific examples and comparative examples.

Examples 1 to 8

Examples 1 to 8 are respectively die casting aluminum alloys, and component ratios of the aluminum alloys in the examples are listed in Table 1.

A preparation method of the aluminum alloys in examples 1 to 8 is as follows: Raw materials are weighed and obtained based on the components of the die casting aluminum alloys in the examples in Table 1. A pure aluminum A00 aluminum ingot (purity: 99.7%), a pure magnesium ingot, an Al-50Si intermediate alloy, an Al-75Fe intermediate alloy, an Al-10Sr intermediate alloy, an aluminum-manganese intermediate alloy, and optional intermediate alloys such as copper, zinc, and titanium are weighed to melt and obtain an alloy melt, then cast the alloy melt to form an alloy ingot, melt the alloy ingot, and form a die casting aluminum alloy through die casting.

The raw materials of the foregoing components are merely an example for description, but are not limited to the foregoing raw materials. A person skilled in the art may select a required raw material based on a specific component.

Comparative Example 1

The comparative example is a commercially available ADC12 alloy, and the alloy mainly includes the following components: silicon: 9.6%-12.0%, magnesium: <0.3%, manganese: ≤0.5%, iron: ≤1.0%, strontium: 0%, copper: 1.5%-3.5%, zinc: ≤1%, and titanium: 0%, and a balance is aluminum.

Comparative Example 2

The comparative example is a commercially available EN 43500 alloy, and the alloy includes the following components: silicon: 9.5%-11.5%, magnesium: 0.1%-0.5%, manganese: 0.5%-0.8%, iron: ≤0.15%, strontium: 0%, and copper: ≤0.1%, and a balance is aluminum.

Comparative Examples 3-8

The comparative examples 3 to 8 are respectively die casting aluminum alloys, and the component ratios of the aluminum alloys in the examples are listed in Table 2.

For the preparation method of the aluminum alloys in the comparative example 3 to 8, refer to the examples 1 to 8.

TABLE 1

| Components | Embodiment 1 | Embodiment 2 | Embodiment 3 | Embodiment 4 | Embodiment 5 | Embodiment 6 | Embodiment 7 | Embodiment 8 |
|---|---|---|---|---|---|---|---|---|
| Silicon | 8.5% | 9.5% | 9% | 9% | 9% | 8.10% | 9.80% | 9% |
| Magnesium | 0.08% | 0.04% | 0.15% | 0.17% | 0.08% | 0.01% | 0.16% | 0.08% |
| Manganese | 0.01% | 0.01% | 0.04% | 0.02% | 0.005% | 0.07% | 0.08% | 0.005% |
| Iron | 1.0% | 0.9% | 0.82% | 0.82% | 0.82% | 0.7% | 1.10% | 0.82% |
| Strontium | 0.01% | 0.02% | 0.005% | 0.02% | 0.04% | 0.008% | 0.05% | 0.04% |
| Copper | 0.005% | 0.005% | 0.008% | 0.005% | 0.005% | 0.005% | 0.005% | / |
| Zinc | 0.003% | 0.003% | 0.005% | 0.003% | 0.003% | 0.003% | 0.003% | / |
| Titanium | 0.003% | 0.003% | 0.003% | 0.005% | 0.003% | 0.003% | 0.003% | / |

TABLE 2

| Components | Comparison example 1 (ADC12 alloy) | Comparison example 2 (EN 43500) | Comparison example 3 | Comparison example 4 | Comparison example 5 | Comparison example 6 | Comparison example 7 | Comparison example 8 |
|---|---|---|---|---|---|---|---|---|
| Silicon | 9.6%-12% | 9.5%-11.5% | 11% | 9% | 9% | 9% | 9.56% | 7.51% |
| Magnesium | ≤0.3% | 0.1%-0.5% | 0.20% | 0.08% | 0.08% | 0.08% | 9.05% | 0.12% |
| Manganese | ≤0.5% | 0.5%-0.8% | 0.60% | 0.005% | 0.005% | 0.005% | 0.47% | 0.46% |
| Iron | ≤1.0% | ≤0.15% | 0.10% | 0.82% | 0.50% | 1.5% | 0.19% | 0.13% |
| Strontium | / | / | 0.04% | / | 0.04% | 0.04% | 0.018% | 0.014% |
| Copper | 1.5%-3.5% | ≤0.10% | 0.08% | 0.005% | 0.005% | 0.005% | / | / |
| Zinc | ≤1% | / | / | 0.003% | 0.003% | 0.003% | / | / |
| Titanium | / | / | / | 0.003% | 0.003% | 0.003% | / | / |

Note: For the aluminum alloys in the examples and comparative examples in Table 1 and Table 2, in addition to the components listed in Table 1 and Table 2, the balance is aluminum and inevitable impurities, and the amount of the impurities is ≤10.15%.

Heat conductivities, mechanical properties (yield strength, tensile strength, and an elongation rate), hardness, and corrosion resistance of the die casting aluminum alloys in the examples 1 to 8 and the comparative examples 1 to 8 were separately tested, and test results are listed in Table 3.

The specific test process of each parameter is as follows.

Heat conductivity test: A laser flash method (ASTM E 1461-01) is used to test the heat conductivity. A sample size is Φ12.7 mm×3 mm; specific heat refers to ISO11357 and ASTM E1269; and density refers to ISO 1183-1:2004.

Mechanical property test: According to the GB/T 228 requirements, standard tensile mechanical test pieces are cut from the die casting aluminum alloys of the examples and the comparative examples, and the mechanical properties are tested on a tensile test machine.

Brinell hardness test: According to the GB/T 231 requirements, the hardness test samples are cut from the die casting aluminum alloys of the examples and the comparative examples. Sample surfaces are smooth surfaces, and there should be no oxide or contaminant. In a process of preparing the sample, an influence of heat or cold processing on surface hardness of the sample should be avoided.

Corrosion resistance test: Corrosion resistance is indicated by a corrosion rate. A test method of a corrosion rate test complies with the GB/T19292.4 and GB/T 16545 standards, and a sample size is 120×100×5 mm. To eliminate an influence of an edge effect, edges around a corrosion rate test sample are wrapped with adhesive tape. After a neutral salt-fog test is performed for 300 h, an average corrosion rate is calculated based on a change of weights of salt fog before and after the test.

It can be learned from the data in Table 3 that comprehensive performance of the die casting aluminum alloys corresponding to the examples 1 to 8 of this application is higher than that of the comparative examples 1 to 8.

It can be learned from the comparison data between the examples 1 to 8 and the comparative example 1 and the comparative example 2 that, when no heat treatment is performed on the die casting aluminum alloys provided in the examples 1 to 8 of this application, all the heat conductivities corresponding to the die casting aluminum alloys are higher than that of the ADC12 alloy and the EN 43500 alloy on which heat treatment is not performed. The heat conductivity of the ADC12 alloy on which heat treatment is not performed is only 96 W/(m·K). However, all the heat conductivities of the die casting aluminum alloys corresponding to the examples 1 to 8 of this application may reach 160 W/(m·K). In addition, all the yield strength, the tensile strength, the elongation rate, and the hardness in the examples 1 to 8 of this application can meet a requirement of the current die casting housing of the communication device.

It can be learned from the comparison data between the example 5 and the comparative example 3 that, after strontium with specific amount is added based on the comparative example 2, comprehensive performance of a die casting aluminum alloy obtained is also far lower than that of the die casting aluminum alloy in this example of this application. In addition, it can be learned from the comparison data between the example 5 and the comparative example 4 that, after the strontium component is removed based on the example 5 of this application, performance of a die casting aluminum alloy obtained is greatly reduced. It can be learned from the comparison data between the example 5 and the comparative examples 5 and 6 that, when the amount of the iron of the die casting aluminum alloy is changed, the

TABLE 3

| Sequence number | Heat conductivity W/(m · K) | Yield strength (MPa) | Tensile strength (MPa) | Elongation rate (%) | Hardness (HBW) | Corrosion rate (mg/(dm$^2$ · d)) |
|---|---|---|---|---|---|---|
| Embodiment 1 | 165 | 120 | 210 | 4.1 | 68 | 3.5 |
| Embodiment 2 | 163 | 122 | 230 | 4.5 | 63 | 3.3 |
| Embodiment 3 | 160 | 132 | 242 | 4.2 | 69 | 3.9 |
| Embodiment 4 | 162 | 139 | 253 | 5.2 | 65 | 4.3 |
| Embodiment 5 | 169 | 132 | 227 | 5.1 | 67 | 3.7 |
| Embodiment 6 | 160 | 102 | 180 | 3.6 | 60 | 4.4 |
| Embodiment 7 | 156 | 128 | 220 | 2.6 | 63 | 4.2 |
| Embodiment 8 | 170 | 130 | 227 | 4.8 | 66 | 4.2 |
| Comparison example 1 | 96 | 120 | 260 | 0.7 | 92 | 34 |
| Comparison example 2 | 140 | 141 | 264 | 4.8 | 79 | 6 |
| Comparison example 3 | 146 | 148 | 275 | 5.2 | 80 | 6.2 |
| Comparison example 4 | 155 | 110 | 192 | 4.8 | 65 | 4.2 |
| Comparison example 5 | 152 | 132 | 217 | 3.9 | 72 | 4.5 |
| Comparison example 6 | 143 | 106 | 192 | 1.3 | 62 | 4.6 |
| Comparison example 7 | 107 | 230 | 315 | 0.2 | 87 | 18 |
| Comparison example 8 | 145 | 146 | 217 | 6.5 | 66 | 3.6 |
| Performance index requirement of a die casting housing of a communication device | 160 | 100 | 180 | 1.5 | 60 | 10 |

heat conductivity of the die casting aluminum alloy is greatly reduced, molding performance of the comparative example 5 is poor, and an elongation rate of comparison 6 is relatively low. It can be proved from the related tests in the example 5 and the comparative examples 3 to 6 that, obtaining of the comprehensive performance of the die casting aluminum alloy in this application is not a result of an action of a single component, but a result of a comprehensive action of various components in the die casting aluminum alloy in this application.

It can be learned from the related data of the examples 1 to 8 and the comparative examples 7 and 8 that, when the amount of the magnesium, the manganese, and the iron in the aluminum alloy falls beyond the scope of this application, although the mechanical properties of the aluminum alloy can be significantly improved, the heat conductivity of the aluminum alloy is significantly reduced.

Molding Performance Comparison

Figure 2:
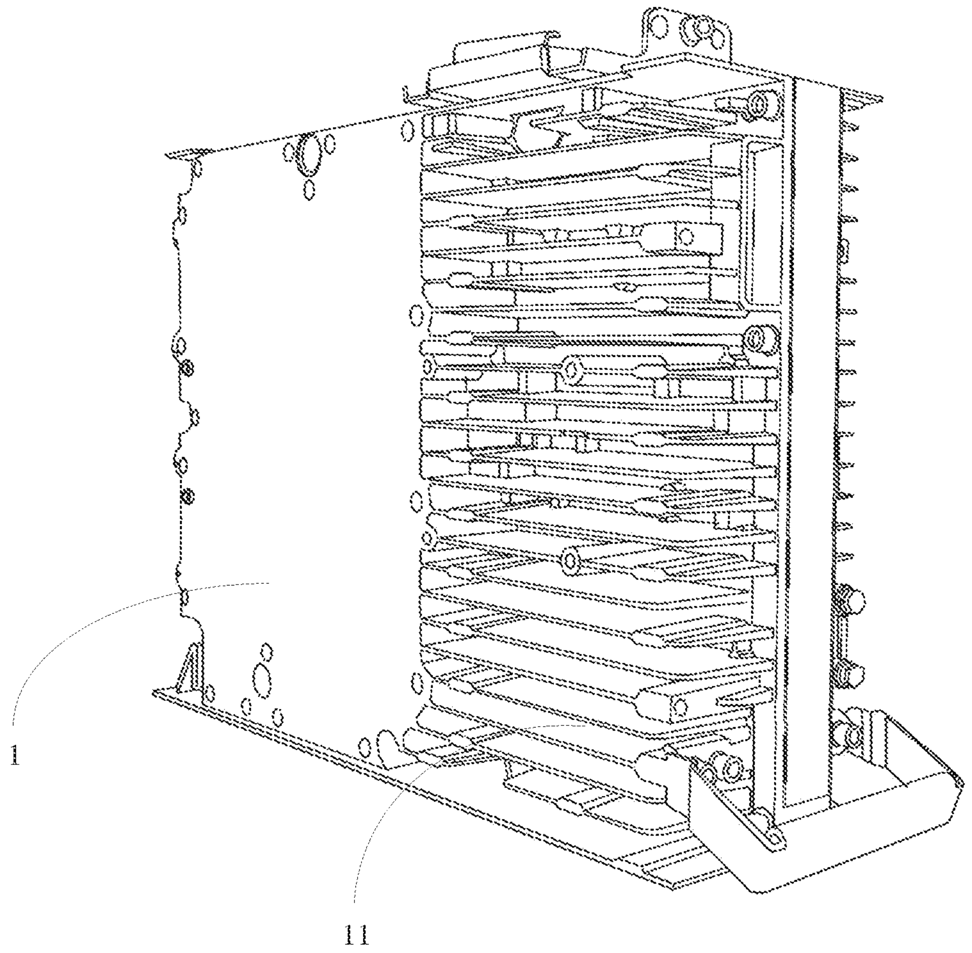
FIG. 2 is a schematic diagram of a structure of a die casting housing according to an embodiment of this application.

Die casting was separately performed by using the aluminum alloys corresponding to the components in the example 1 to 8 and the comparative example 1 to 6, to form a die casting housing of a remote radio unit in the communication device. As shown in FIG. 2, a structure of the die casting housing 1 includes a thin-wall heat sink fin 11. When the molding performance of the alloy is poor, the thin-wall heat sink fin 11 is prone to a material shortage defect. A quantity of samples corresponding to each example and each comparative example is 30. A material shortage feature on the thin-wall heat sink fin 11 of each sample is collected, and a maximum three-dimensional size of each material shortage opening is measured to evaluate the molding performance of the aluminum alloy. The maximum three-dimensional size (R) is described as follows: 0.5 mm≤R≤1.0 mm; 1.0 mm<R≤3 mm; and R>3 mm. Herein, 0.5 mm≤R≤1.0 mm indicates that the molding performance is optimal, followed by 1.0 mm<R≤3 mm, and R>3 mm indicates that the molding performance is the worst. Statistical results are listed in Table 4. The die casting housing is a body of the remote radio unit, and the body may include modules such as a processing unit (for example, a processor) or a power module.

TABLE 4

| Sequence number | Total quantity of defects | 0.5 mm ≤ R ≤ 1.0 mm | 1.0 mm < R ≤ 3 mm | R > 3 mm |
|---|---|---|---|---|
| Embodiment 1 | 210 | 102 | 80 | 20 |
| Embodiment 2 | 225 | 110 | 95 | 24 |
| Embodiment 3 | 218 | 106 | 88 | 23 |
| Embodiment 4 | 212 | 109 | 92 | 22 |
| Embodiment 5 | 213 | 107 | 91 | 24 |
| Embodiment 6 | 206 | 93 | 92 | 20 |
| Embodiment 7 | 216 | 103 | 97 | 23 |
| Embodiment 8 | 220 | 101 | 99 | 22 |
| Comparison example 1 | 201 | 90 | 90 | 21 |
| Comparison example 2 | 208 | 95 | 85 | 19 |
| Comparison example 3 | 209 | 97 | 84 | 19 |
| Comparison example 4 | 207 | 99 | 94 | 23 |
| Comparison example 5 | 242 | 122 | 110 | 32 |
| Comparison example 6 | 232 | 115 | 101 | 27 |

TABLE 4-continued

| Sequence number | Total quantity of defects | 0.5 mm ≤ R ≤ 1.0 mm | 1.0 mm < R ≤ 3 mm | R > 3 mm |
|---|---|---|---|---|
| Comparison example 7 | 241 | 122 | 112 | 29 |
| Comparison example 8 | 246 | 127 | 117 | 34 |

It can be learned from the data in Table 4 that, a total quantity of defects of the aluminum alloys in the examples 1 to 8 of this application and a quantity of defects of various sizes are basically the same as those in the comparative example 1 and the comparative example 2. This indicates that the molding performance of the aluminum alloy having the component ratio in this example of this application can reach a level of the existing ADC12 alloy and the existing EN 43500 alloy. However, a quantity of defects of the aluminum alloys corresponding to the comparative example 5 to the comparative example 8, especially the aluminum alloys corresponding to the comparative example 5, the comparative example 7, and the comparative example 8, obviously increases. This also indicates that, based on examples of this application, when the amount of a component in the aluminum alloy is changed, molding performance of an obtained aluminum alloy is affected.

In conclusion, it can be learned from the test data in Table 3 and Table 4 that, the heat conductivity corresponding to the aluminum alloy in the examples 1 to 8 of this application in a die casting state may exceed the heat conductivity of the existing ADC12 alloy and EN 43500 alloy, and reach 160 W/(m·K). In addition, the molding performance of the aluminum alloy in the examples 1 to 8 may basically reach a molding level of the ADC12 alloy and the EN 43500 alloy. Therefore, the aluminum alloy in examples of this application can be used to prepare a large complex thin-wall housing, the obtained die casting aluminum alloy can also have a relatively high heat conductivity.

Influence of Heat Treatment

The heat conductivities, the mechanical properties (the yield strength, the tensile strength, and the elongation rate), the hardness, and the corrosion resistance of the die casting aluminum alloys corresponding to the examples 1 to 8 and the comparative examples 1 to 8 after heat treatment were separately tested. Specific heat treatment processes used by the die casting aluminum alloys corresponding to the examples and the comparative examples are listed in Table 5, and test results are listed in Table 6.

TABLE 5

| Sequence number | Heat treatment temperature/time |
|---|---|
| Embodiment 1 | 180° C./2 h-3 h |
| Embodiment 2 | 260° C./2 h-3 h |
| Embodiment 3 | 260° C./2 h-3 h |
| Embodiment 4 | 320° C./2 h-3 h |
| Embodiment 5 | 320° C./2 h-3 h |
| Embodiment 6 | 260° C./2 h-3 h |
| Embodiment 7 | 260° C./2 h-3 h |
| Embodiment 8 | 180° C./2 h-3 h |
| Comparison example 1 | 320° C./2 h-3 h |
| Comparison example 2 | 320° C./2 h-3 h |
| Comparison example 3 | 320° C./2 h-3 h |
| Comparison | 320° C./2 h-3 h |

TABLE 5-continued

| Sequence number | Heat treatment temperature/time |
|---|---|
| example 4 | |
| Comparison example 5 | 320° C./2 h-3 h |
| Comparison example 6 | 320° C./2 h-3 h |
| Comparison example 7 | 320° C./2 h-3 h |
| Comparison example 8 | 320° C./2 h-3 h |

TABLE 6

| Sequence number | Heat conductivity W/(m · K) | Yield strength (MPa) | Tensile strength (MPa) | Elongation rate (%) | Hardness (HBW) | Corrosion rate (mg/(dm$^2$ · d)) |
|---|---|---|---|---|---|---|
| Embodiment 1 | 181 | 122 | 210 | 6.2 | 61 | 4.3 |
| Embodiment 2 | 182 | 121 | 206 | 6.7 | 62 | 4.2 |
| Embodiment 3 | 180 | 118 | 207 | 6.1 | 63 | 3.1 |
| Embodiment 4 | 184 | 119 | 200 | 6.7 | 60 | 4.1 |
| Embodiment 5 | 189 | 110 | 191 | 7.1 | 61 | 4.0 |
| Embodiment 6 | 183 | 100 | 200 | 5.7 | 55 | 4.3 |
| Embodiment 7 | 175 | 107 | 202 | 4.8 | 60 | 4.4 |
| Embodiment 8 | 191 | 109 | 201 | 7.4 | 62 | 4.4 |
| Comparison example 1 | 120 | 110 | 234 | 1.2 | 79 | 34 |
| Comparison example 2 | 160 | 118 | 203 | 7.2 | 64 | 6.0 |
| Comparison example 3 | 172 | 132 | 245 | 7.2 | 69 | 7.5 |
| Comparison example 4 | 173 | 99 | 177 | 6.2 | 59 | 4.2 |
| Comparison example 5 | 161 | 118 | 197 | 4.1 | 63 | 4.3 |
| Comparison example 6 | 168 | 100 | 185 | 5.2 | 59 | 4.5 |
| Comparison example 7 | 125 | 212 | 299 | 0.9 | 81 | 16 |
| Comparison example 8 | 163 | 141 | 202 | 7.5 | 61 | 3.5 |

It can be learned from the data in Table 6 that, after heat treatment is performed on the die casting aluminum alloy provided in the examples 1 to 8 of this application, the heat conductivity of the die casting aluminum alloy may reach 180 W/(m·K), which is far higher than that of the die casting aluminum alloy in the comparative example 1 to the comparative example 8.

It can be learned from the foregoing analysis that, the die casting aluminum alloy in examples of this application has a high heat conductivity, excellent molding performance, high corrosion resistance, and specific mechanical properties by properly designing the components, and is applicable to preparing components and parts of a communication product with a complex structure. This can resolve a problem in the conventional technology that a heat treatment process needs to be added to the die casting aluminum alloy to improve the heat conductivity.

It should be noted that, in this application, unless otherwise specified, all the implementations and preferred implementation methods mentioned in this specification may be mutually combined to form a new technical solution. In this application, unless otherwise specified, all the technical features and preferred features mentioned in this specification may be combined to form a new technical solution. In this application, unless otherwise specified, the percentage (%) or part refers to a weight percentage or a weight part relative to the composition. In this application, unless otherwise specified, the involved components or the preferred components thereof may be combined to form a new technical solution. In this application, unless otherwise stated, a value range "a-b" represents an abbreviated representation of any real number combination between a and b, and includes a and b, where both a and b are real numbers. For example, the value range "6-22" indicates that all real numbers between "6-22" are listed in this specification, and "6-22" is only an abbreviated representation of these value combinations. The "range" disclosed in this application is in a form of a lower limit and an upper limit, and may be one or more lower limits and one or more upper limits respectively. In this application, unless otherwise specified, reactions or operation steps may be performed in sequence, or may be performed in sequence. Preferably, the reaction method in this specification is performed in sequence.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An aluminum alloy, based on mass percentage, consisting of:

silicon: 8.0%-10.0%, magnesium: 0.001%-0.2%, manganese: 0.001%-0.09%, iron: 0.7%-1.3%, strontium: 0.001%-0.05%, and optionally one or more of the following: (i) copper: less than or equal to 0.1%, (ii) zinc: less than or equal to 0.1%, and (iii) titanium: less than or equal to 0.1%, with a balance of aluminum and inevitable impurities, wherein the inevitable impurities account for ≤0.15%.

2. The aluminum alloy according to claim 1, based on mass percentage, consisting of: silicon 8.0%-9.5%, magnesium 0.05%-0.15%, manganese: 0.001%-0.05%, iron: 0.7%-1.0%, strontium: 0.01%-0.05%, and optionally one or more of the following: (i) copper: less than or equal to 0.1%, (ii) zinc: less than or equal to 0.1%, and (iii) titanium: less than or equal to 0.1%, with a balance of aluminum and inevitable impurities, wherein the inevitable impurities account for ≤0.15%.

3. The aluminum alloy according to claim 1, based on mass percentage, consisting of: silicon: 8.2%-9.4%, magnesium: 0.05%-0.09%, manganese: 0.001%-0.02%, iron: 0.72%-0.85%, strontium 0.02%-0.05%, and optionally one or more of the following: (i) copper: less than or equal to 0.1%, (ii) zinc: less than or equal to 0.1%, and (iii) titanium: less than or equal to 0.1%, with a balance of aluminum and inevitable impurities, wherein the inevitable impurities account for ≤0.15%.

4. The aluminum alloy according to claim 1, wherein based on mass percentage, the aluminum alloy comprises the copper in an amount of 0.001%-0.1%.

5. The aluminum alloy according to claim 4, wherein based on mass percentage, the amount of the copper in the aluminum alloy is 0.001%-0.05%.

6. The aluminum alloy according to claim 4, wherein based on mass percentage, the amount of the copper in the aluminum alloy is 0.001%-0.02%.

7. The aluminum alloy according to claim 1, wherein based on mass percentage, the aluminum alloy comprises the zinc in an amount of 0.001%-0.1%.

8. The aluminum alloy according to claim 7, wherein based on mass percentage, the amount of the zinc in the aluminum alloy is 0.001%-0.05%.

9. The aluminum alloy according to claim 7, wherein based on mass percentage, the amount of the zinc in the aluminum alloy is 0.001%-0.02%.

10. The aluminum alloy according to claim 1, wherein based on mass percentage, the aluminum alloy comprises the titanium in an amount of 0.001%-0.1%.

11. The aluminum alloy according to claim 10, wherein based on mass percentage, the amount of the titanium in the aluminum alloy is 0.001%-0.05%.

12. The aluminum alloy according to claim 10, wherein based on mass percentage, the amount of the titanium in the aluminum alloy is 0.001%-0.02%.

13. The aluminum alloy according to claim 1, wherein the aluminum alloy in a die casting state has the following characteristics: a heat conductivity of ≥160 W/(m·K), a yield strength of ≥120 MPa, a tensile strength of ≥200 MPa, an elongation rate of ≥2%, a Brinell hardness of 60-80 HBW, and a corrosion rate of ≤4.5 mg/($dm^2$·d).

14. The aluminum alloy according to claim 1, characterized in that after heat treatment is performed on the aluminum alloy, the aluminum alloy has the following characteristics: a heat conductivity of ≥180 W/(m·K), a yield strength of ≥100 MPa, a tensile strength of ≥180 MPa, an elongation rate of ≥2%, a Brinell hardness of 60-80 HBW, and a corrosion rate of ≤4.5 mg/($dm^2$·d).

15. An electronic device, comprising a housing and a body in the housing, wherein the body comprises a processing unit of the electronic device, and a part or all of the housing is an aluminum alloy; wherein the aluminum alloy, based on mass percentage, consists of:

silicon: 8.0%-10.0%, magnesium: 0.001%-0.2%, manganese: 0.001%-0.09%, iron: 0.7%-1.3%, strontium: 0.001%-0.05%, and optionally one or more of the following: (i) copper: less than or equal to 0.1%, (ii) zinc: less than or equal to 0.1%, and (iii) titanium: less than or equal to 0.1%, with a balance of aluminum and inevitable impurities, wherein the inevitable impurities account for ≤0.15%.

16. The electronic device according to claim 15, wherein the aluminum alloy, based on mass percentage, consists of: silicon 8.0%-9.5%, magnesium 0.05%-0.15%, manganese: 0.001%-0.05%, iron: 0.7%-1.0%, strontium: 0.01%-0.05%, and optionally one or more of the following: (i) copper: less than or equal to 0.1%, (ii) zinc: less than or equal to 0.1%, and (iii) titanium: less than or equal to 0.1%, with a balance of aluminum and inevitable impurities, wherein the inevitable impurities account for ≤0.15%.

17. The electronic device according to claim 15, wherein the aluminum alloy, based on mass percentage, consists of: silicon: 8.2%-9.4%, magnesium: 0.05%-0.09%, manganese: 0.001%-0.02%, iron: 0.72%-0.85%, strontium 0.02%-0.05%, and optionally one or more of the following: (i) copper: less than or equal to 0.1%, (ii) zinc: less than or equal to 0.1%, and (iii) titanium: less than or equal to 0.1%, with a balance of aluminum and inevitable impurities, wherein the inevitable impurities account for ≤0.15%.

18. The electronic device according to claim 15, wherein based on mass percentage, the aluminum alloy comprises the copper in an amount of 0.001%-0.1%.

19. The electronic device according to claim 18, wherein based on mass percentage, the amount of the copper in the aluminum alloy is 0.001%-0.05%.

* * * * *